(12) United States Patent
Kwon et al.

(10) Patent No.: US 7,465,672 B2
(45) Date of Patent: Dec. 16, 2008

(54) METHOD OF FORMING ETCHING MASK

(75) Inventors: Gi-Chung Kwon, Gyeonggi-Do (KR); Nae-Eung Lee, Gyeonggi-Do (KR); Chang-Ki Park, Busan (KR); Chun-Hee Lee, Gyeongsangbuk-Do (KR); Duck-Ho Kim, Seoul (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 0 days.

(21) Appl. No.: 11/556,127

(22) Filed: Nov. 2, 2006

(65) Prior Publication Data

US 2007/0114205 A1     May 24, 2007

(51) Int. Cl.
  *H01L 21/302* (2006.01)
(52) U.S. Cl. ................. 438/724; 438/725
(58) Field of Classification Search ............ 438/706, 438/710, 712, 714, 723, 724, 725
  See application file for complete search history.

(56) References Cited

U.S. PATENT DOCUMENTS

| | | | |
|---|---|---|---|
| 4,529,476 A | 7/1985 | Kawamoto et al. | |
| 4,910,122 A | 3/1990 | Arnold et al. | |
| 5,438,006 A | 8/1995 | Chang et al. | |
| 5,858,847 A | 1/1999 | Zhou et al. | |
| 5,986,344 A | 11/1999 | Subramanion et al. | |
| 6,335,143 B1 | 1/2002 | Sumino et al. | |
| 6,579,809 B1* | 6/2003 | Yang et al. | 438/734 |
| 6,635,185 B2* | 10/2003 | Demmin et al. | 216/64 |
| 6,743,725 B1 | 6/2004 | Hu et al. | |
| 6,833,325 B2* | 12/2004 | Huang et al. | 438/714 |
| 2005/0191852 A1* | 9/2005 | Takigawa et al. | 438/637 |
| 2006/0084243 A1* | 4/2006 | Zhang et al. | 438/478 |
| 2006/0166416 A1* | 7/2006 | Dalton et al. | 438/153 |
| 2006/0214231 A1* | 9/2006 | Shah et al. | 257/347 |
| 2006/0270214 A1* | 11/2006 | Iba | 438/637 |

* cited by examiner

*Primary Examiner*—Kin-Chan Chen
(74) *Attorney, Agent, or Firm*—Marger Johnson & McCollom PC

(57) ABSTRACT

The present invention relates to a method of forming an etching mask. According to the present invention, there is provided a method of forming an etching mask, comprising the steps of: depositing a hard mask film containing silicon on a substrate; depositing a photoresist on the hard mask film; patterning the photoresist; and etching the hard mask film using the photoresist pattern as an mask and using an etching gas including a $CH_xF_y$ (x, y=1, 2, 3) gas. At this time, an etch selectivity of the hard mask film to the photoresist pattern can be increased using a mixed gas including $CH_2F_2$ and $H_2$ gases when etching the hard mask film under the photoresist pattern used in a wavelength of 193 nm or less.

7 Claims, 9 Drawing Sheets

(a)

(b)

METHOD OF FORMING ETCHING MASK

CROSS-REFERENCE TO RELATED APPLICATIONS

This U.S. non-provisional patent application claims priority under 35 U.S.C. § 119 of Korean Patent Applications 2005-0104528 filed on Nov. 2, 2005, the entire contents of which are hereby incorporated by reference.

BACKGROUND OF THE INVENTION

1. Field of Invention

The present invention relates to a method of forming an etching mask, and more particularly, to a method of forming an etching mask with a high etch selectivity of a hard mask for forming a thin film pattern to a photoresist.

2. Description of the Prior Art

Conventionally, in order to form a thin film pattern, a G-line (436 nm) resist and an I-line (365 nm) resist or a KrF (248 nm) resist are applied, and a photoresist pattern is then formed by performing a photolithography process using a mask. Thereafter, a thin film pattern is formed by performing an etching process using the photoresist pattern as an etching mask.

However, due to the reduction of the line width of a device and the limit of a photolithography process, a thin film pattern with an ultra-fine line width is currently formed using an ArF (193 nm) resist and a hard mask pattern in a line width of 80 nm or less.

FIGS. 1A to 1C are sectional views conceptually illustrating a problem of a conventional method of forming a thin film pattern using an ArF (193 nm) resist and a hard mask pattern.

Referring to FIG. 1A, a thin film 20 to be patterned is formed on a substrate 10. A hard mask film 30 and a photoresist pattern 40 are formed on the thin film 20. The hard mask film 30A is made of silicon nitride film, while the photoresist pattern 40 is made of an ArF resist. This is because the thickness of a resist is reduced due to the limit of a lithography process so that only the existing resist does not serve as a sufficient etch barrier mask. Thus, the hard mask film 30 is formed between the resist and the thin film, thus to use it as an etching mask.

Referring to FIGS. 1B and 1C, to use the hard mask film 30 as an etching mask, the hard mask film 30 is patterned by etching the hard mask film 30 using an ArF photoresist pattern 40. Thereafter, the lower thin film is patterned by performing an etching process using the patterned ArF photoresist and hard mask film 30 as an etching mask.

However, since an etch selectivity of the hard mask film 30 to the photoresist pattern 40 is low when patterning the conventional hard mask film 30 and thus a mask film is eroded, there is a problem in that the pattern of the hard mask film 30 with a desired shape is not formed.

A mixed gas in which oxygen ($O_2$) is mixed with a fluorocarbon-based gas is used as an existing etching gas for etching the hard mask film 30. However, the etch selectivity of the silicon nitride film used as the hard mask film 30 to the ArF photoresist is in a range between 1.5:1 and 4:1 when the aforementioned mixed gas is used. Thus, there is caused a problem in that the photoresist is also removed when the hard mask film 30 is etched, or the durability of the photoresist is weakened by the mixed gas when etching the hard mask film 30 having the same thickness as the photoresist and the photoresist is collapsed.

That is, the hard mask film 30 and the thin film 20 should be patterned such that each thereof has a width identical with width A between the initial photoresist patterns 40 as shown in FIG. 1A. However, since the etch selectivity of the hard mask film 30 of the photoresist pattern 40 is low as described above, the photoresist pattern 40 is also removed when the hard mask film 30 is etched. Accordingly, a pattern of the hard mask film 30 with width B larger than the desired width A is formed as shown in FIG. 1B. Thereafter, in a case where the thin film 20 is patterned by performing an etching process using the pattern of the hard mask film 30 with the aforementioned large width as an etching mask, there is caused a problem in that a thin film pattern with a width larger than that of an initially desired shape is formed.

Further, although not shown, since the durability of the photoresist is weakened in the etching process for the pattern of the hard mask film 30, the photoresist pattern 40 is collapsed. Accordingly, there is caused a problem in that the lower hard mask film 30 is not patterned, and thus it is impossible to pattern the thin film 20.

SUMMARY OF THE INVENTION

Accordingly, the present invention is conceived to solve the aforementioned problems in the prior art. An object of the present invention is to provide a method of forming an etching mask, capable of increasing an etch selectivity of a hard mask film to a photoresist film for forming a fine line width of 193 nm or less, and enhancing an etch rate of the hard mask film.

According to an aspect of the present invention, there is provided a method of forming an etching mask, comprising the steps of: depositing a hard mask film containing silicon on a substrate; depositing a photoresist on the hard mask film; patterning the photoresist; and etching the hard mask film using the photoresist pattern as a mask and using an etching gas including a $CH_xF_y(x, y=1, 2, 3)$ gas.

It is preferred that the etching gas be $CH_2F_2$ gas and be injected at a flow rate of 10 to 100 sccm. The etching gas may further comprise $H_2$ gas. It is effective that the $H_2$ gas is injected at a flow rate of 20 to 150 sccm. It is preferred that the etching gas further comprise Ar.

The hard mask film may be formed in a single or multiple layer film of at least any one of silicon nitride and silicon oxide.

It is preferred that the photoresist comprise any one of ArF (193 nm), F2 (157 nm) and EUV (extreme ultraviolet) resists.

In addition, the method preferably comprises the steps of depositing a anti reflective coating (ARC) between the hard mask film and the photoresist pattern; and etching the ARC before etching the hard mask film.

According to another aspect of the present invention, there is provided a method of forming an etching mask to etch a film under a hard mask film on a substrate having the hard mask film containing silicon and a patterned photoresist sequentially formed thereon, the method comprising the step of: etching the hard mask film using the photoresist pattern as a mask and using an etching gas including a $CH_xF_y(x, y=1, 2, 3)$ gas.

Here, it is preferred that the etching gas be $CH_2F_2$ gas and be injected at a flow rate of 10 to 100 sccm. It is also preferred that the etching gas further comprise $H_2$ gas injected at a flow rate of 20 to 150 sccm. It is effective that the etching gas further comprises Ar gas injected at a flow rate of 200 to 800 sccm.

It is preferred that the photoresist comprise any one of ArF (193 nm), $F_2$ (157 nm) and FUV (extreme ultraviolet) resists.

In addition, according to a further aspect of the present invention, there is provided a method of forming an etching mask to etch a film under a hard mask film on a substrate having the hard mask film containing silicon, a ARC and a patterned photoresist sequentially formed thereon, the method comprising the steps of: etching the ARC using the photoresist pattern as a mask; and etching the hard mask film using the photoresist pattern and ARC as a mask and using an etching gas including a $CH_xF_y$ (x, y=1, 2, 3) gas.

At this time, it is preferred that the etching gas be $CH_2F_2$ gas and be injected at a flow rate of 10 to 100 sccm. It is effective that the etching gas further comprises $H_2$ gas injected at a flow rate of 20 to 150 sccm. It is also preferred that the etching gas further comprise Ar gas injected at a flow rate of 200 to 800 sccm.

It is preferred that the photoresist comprise any one of ArF (193 nm), $F_2$ (157 nm) and EUV (extreme ultraviolet) resists.

Further, according to a still further aspect of the present invention, there is provided a method of forming an etching mask to etch a film under a hard mask film on a substrate having the hard mask film containing silicon, a ARC and a patterned photoresist sequentially formed thereon, the method comprising the steps of: etching the ARC using the photoresist pattern as a mask; and etching the hard mask film using the photoresist pattern and ARC as a mask while a surface of the photoresist pattern is polymerized, and using an etching gas including a $CH_xF_y$ (x, y=1, 2, 3) gas.

Here, it is preferred that the etching gas be $CH_2F_2$ gas and be injected at a flow rate of 10 to 100 sccm. In addition, it is more preferred that the etching gas further comprise $H_2$ gas injected at a flow rate of 20 to 150 sccm.

It is effective that the photoresist uses any one of ArF (193 nm), $F_2$ (157 nm) and EUV (extreme ultraviolet) resists.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE PREFERRED EMBODIMENT

Figure 1A:
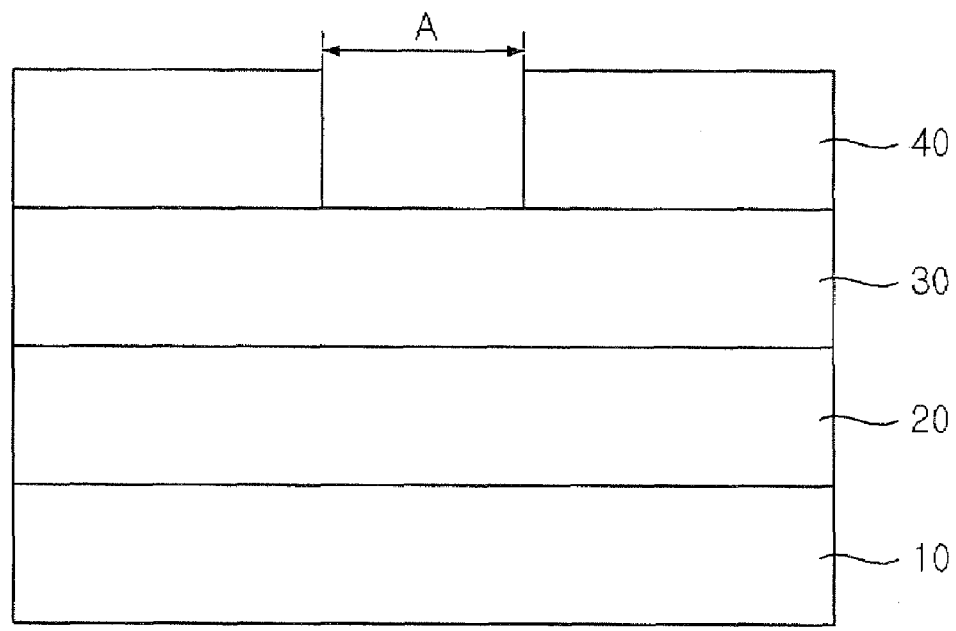
FIGS. 1A to 1C are sectional views conceptually illustrating a problem of a conventional method of forming a thin film pattern using an ArF (193 nm) resist and a hard mask pattern.
Figure 1B:
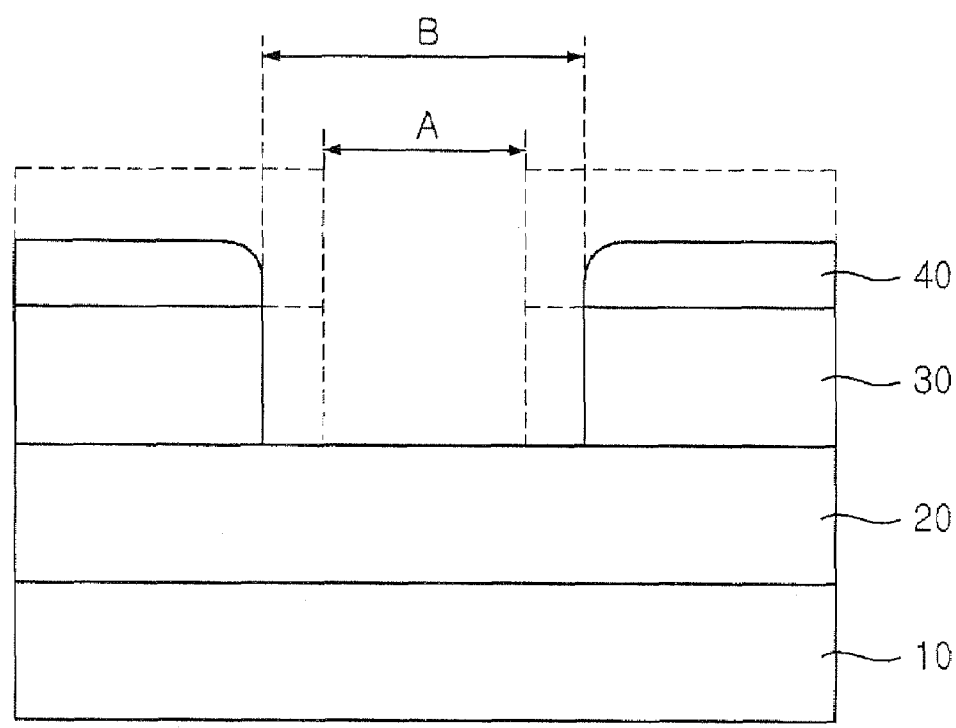
Figure 1C:
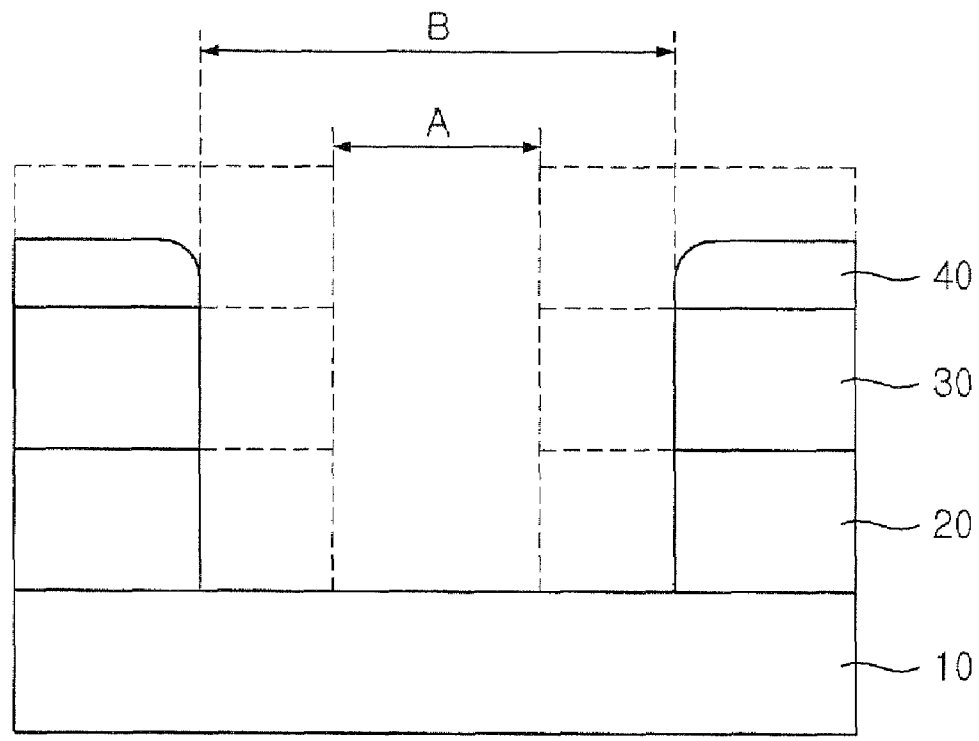

Hereinafter, preferred embodiments of the present invention will be described in detail with reference to the accompanying drawings. However, the present invention is not limited to the embodiments to be disclosed below but may be implemented into a variety of different forms. The embodiments are provided only for illustrative purposes and for full understanding of the scope of the present invention to those skilled in the art. Throughout the drawings, like elements are designated by like reference numerals.

FIGS. 2A to 2D are sectional views illustrating a method of forming a thin film pattern according to the embodiment of the present invention.

Figure 2A:
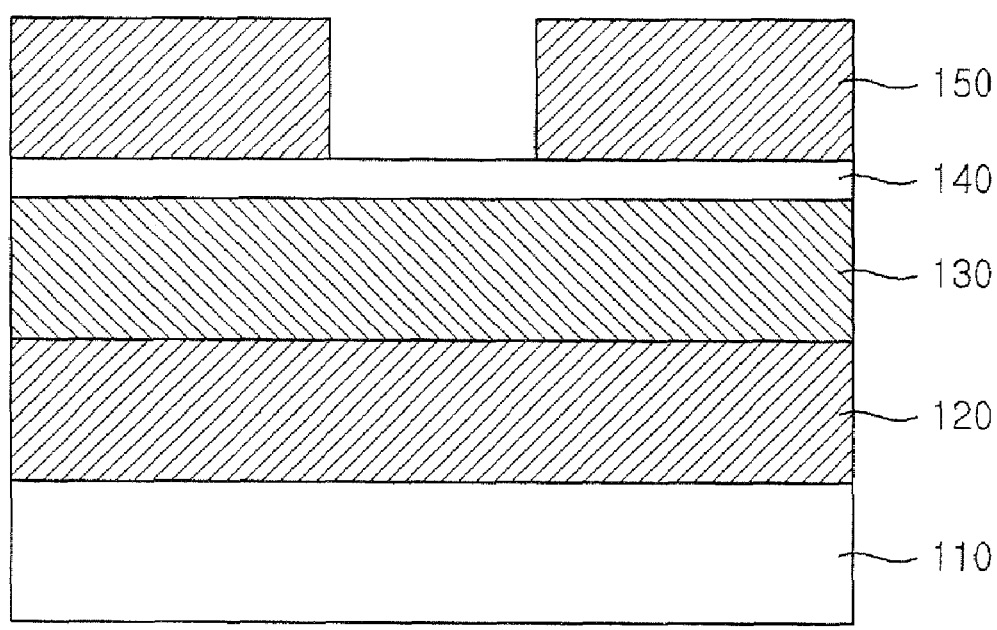
FIGS. 2A to 2D are sectional views illustrating a method of forming a thin film pattern according to an embodiment of the present invention.

As shown in FIG. 2A, a thin film 120, a hard mask film 130 and a anti reflective coating (ARC) 140 are formed on a substrate 110. Thereafter, photoresist is applied to the ARC 140, and a photoresist pattern 150 is then formed by performing a lithography process using a mask.

Here, as the substrate 110, not only a semiconductor substrate for manufacturing a semiconductor device but also a transparent insulative substrate for manufacturing a flat panel display device may be used. The thin film 120 is not limited thereto but may be a thin film for manufacturing a semiconductor device or flat panel display device.

Preferably, as the hard mask film 130, a film having a high etch selectivity with respect to the lower thin film 120 is used. It is also preferred that a silicon nitride film (SiN) be used as the hard mask film 130 in this embodiment. The ARC 140 is applied in a thickness of 10 to 50 nm using a film for minimizing light reflection generated in a light exposing process for forming the photoresist pattern 150 formed on the ARC 140.

Thereafter, a photoresist used in a wavelength of 193 nm or less is applied to the ARC 140 through a spin coating method. Preferably, any one of ArF (193 nm), $F_2$ (157 nm) and EUV (extreme ultraviolet) resists is used as the photoresist.

In this embodiment, the ArF resist is applied. The ArF resist pattern 150 is formed by performing a photolithography process using a mask for forming a thin film. That is, the ArF resist is applied to the ARC through a spin coating method, and then loaded into a 193 nm light exposing equipment. Thereafter, an ArF photoresist pattern is formed by performing a light exposing process using a mask for patterning a thin film and then a developing process.

Figure 2B:
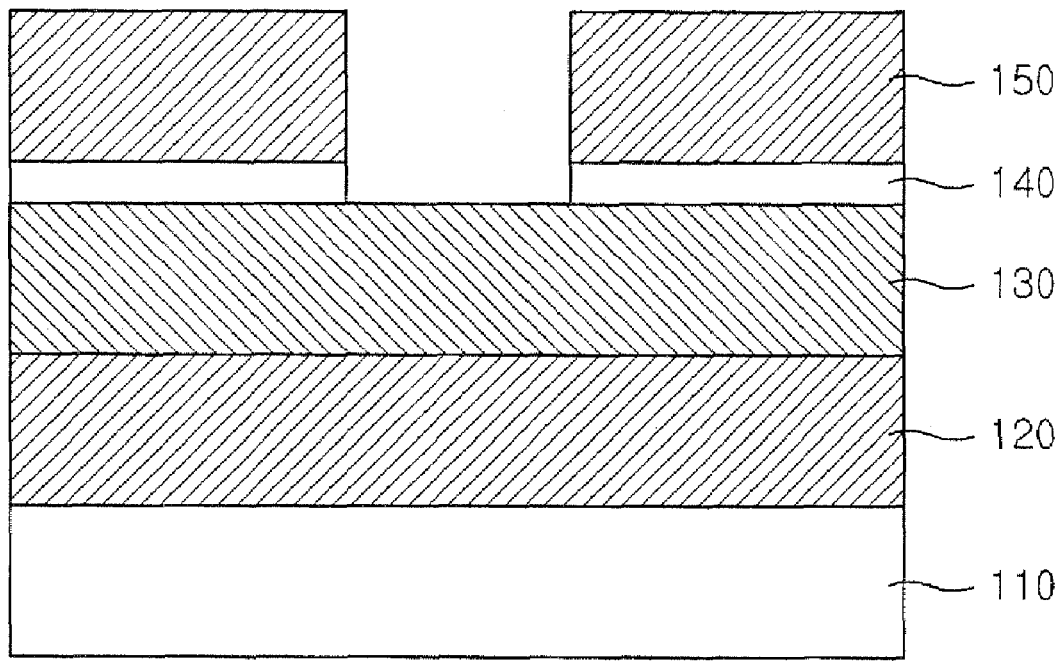

As shown in FIG. 2B, the exposed ARC 140 is etched by performing an etching process using the ArF resist pattern 150 as an etching mask. That is, it is effective that the ARC 140 is removed by performing a plasma etching process using a mixed gas of $CF_4/O_2/C_4F_6$/Ar. At this time, it is preferred that the $CF_4$, $O_2$, $C_4F_6$ and Ar gases be supplied at flow rates of 20 to 40 sccm, 1 to 20 sccm, 1 to 20 sccm and 200 to 800 sccm to a plasma etching apparatus, respectively.

Figure 2C:
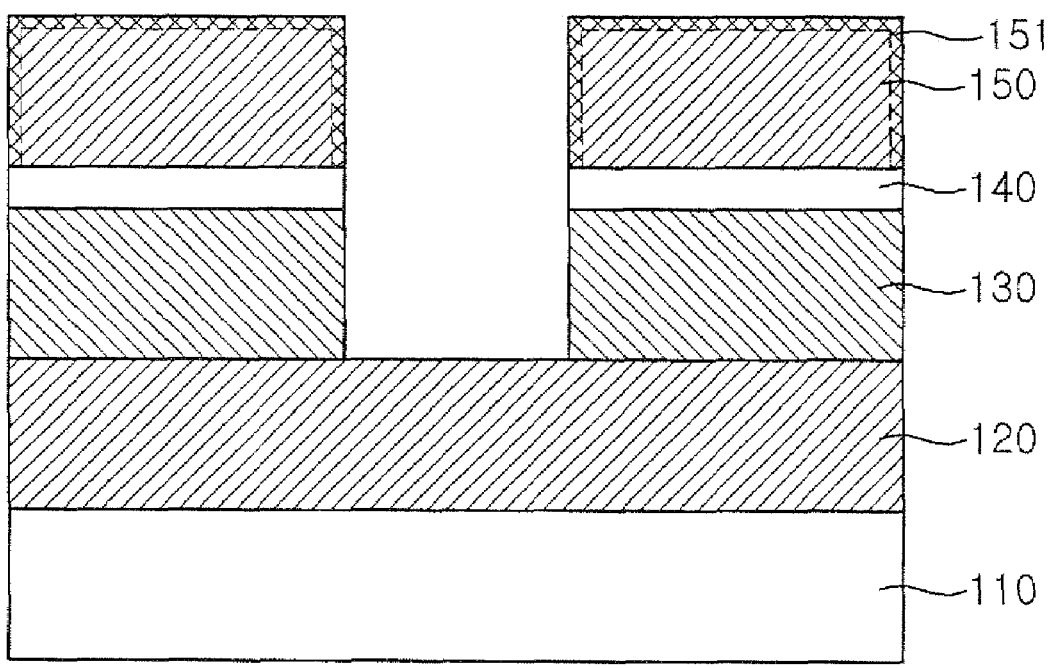

Next, the hard mask film 130 is etched as shown in FIG. 2C, in which an etching process with an enhanced etch selectivity of the hard mask film 130 to the photoresist pattern 150 is performed by using an etching gas including an enhancing gas for the photoresist pattern 150.

Here, as the etching gas, a mixed gas of $CH_xF_y$(x, y=1, 2, 3) and $H_2$ is preferably used. In a case where the mixed gas is used, a surface of the ArF photoresist pattern 150 is polymerized into a polymer 151 to have an almost infinite etch selectivity at which the ArF photoresist pattern 150 is not removed but only the lower hard mask film 130 is etched.

In this embodiment, a mixed gas of $CH_2F_2$/$H_2$/Ar is used as the etching gas. Further, it is preferred that the $CH_2F_2$, $H_2$ and Ar gases be injected at flow rates of 10 to 200 sccm, 20 to 200 sccm and 100 to 1000 sccm in the etching process, respectively.

Figure 3:
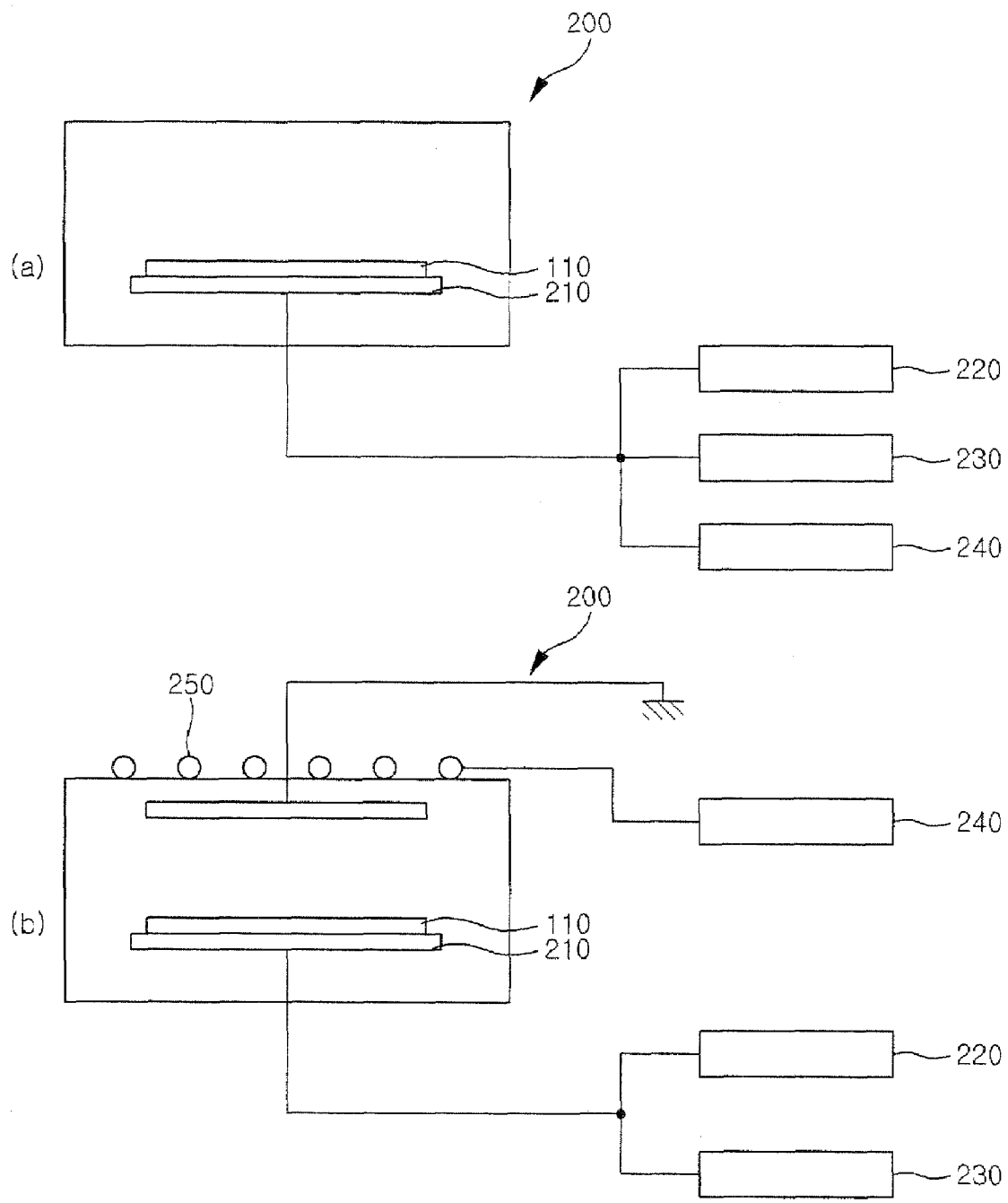
FIG. 3 is a conceptual view of an apparatus for etching a hard mask film according to the present invention.

The aforementioned etching process will be described as follows:

As described above, the substrate 110 having the photoresist pattern 150 formed on the hard mask film 130 is loaded into a chamber of an etching equipment 200 shown in FIG. 3 such that the substrate 110 is seated on a substrate supporting means 210. Preferably, an electrostatic chuck is used as the substrate supporting means 210. Further, it is preferred that the temperature of the electrostatic chuck be maintained to be −10 to 80 degrees Celsius in an etching process. The pressure in the etching equipment 200, i.e., the chamber is maintained to be 1 to 500 mTorr. Thereafter, the $CH_2F_2$, $H_2$ and Ar gases are injected into the etching equipment 200, and the etching process is progressed by generating plasma.

Preferably, the etching equipment 200 applies different high-frequency power to the substrate supporting means 210 as shown in FIG. 3(a). At this time, first, second and third high-frequency power sources 220, 230 and 240 preferably apply voltages of frequencies of 400 KHz to 10 MHz, 10 to 30 MHz and 10 to 100 MHz, respectively. Further, the etching equipment 200 may apply different high-frequency power to the substrate supporting means 210 and apply frequency power to an antenna 250 in an upper portion of the etching equipment 200, as shown in FIG. 3(b). That is, the first and second high-frequency power sources 220 and 230 apply the voltages of frequencies of 400 KHz to 10 MHz and 10 to 30 MHz to the substrate supporting means 210 serving as a lower electrode, while the third high-frequency power source 240 applies the voltage of a frequency of 10 to 100 MHz to the antenna 250 provided above the substrate supporting means 210.

In the above, the first and second high-frequency power sources 220 and 230 preferably apply electric power of 100 to 400 W and 300 to 600 W, respectively.

An etch rate and an etch selectivity can be adjusted using the aforementioned etching gas and etching equipment 200. That is, it is possible to obtain an etch selectivity at which the photoresist pattern 150 is never removed when the hard mask film 130 is etched.

Figure 4:
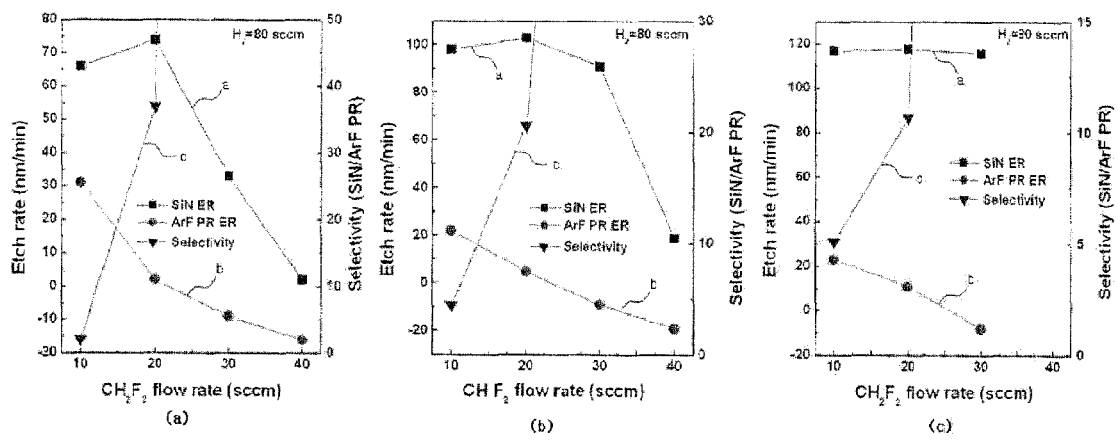
FIG. 4 is a graph illustrating an etch rate according to a change in flow rate of $CH_2F_2$ gas.
Figure 5:
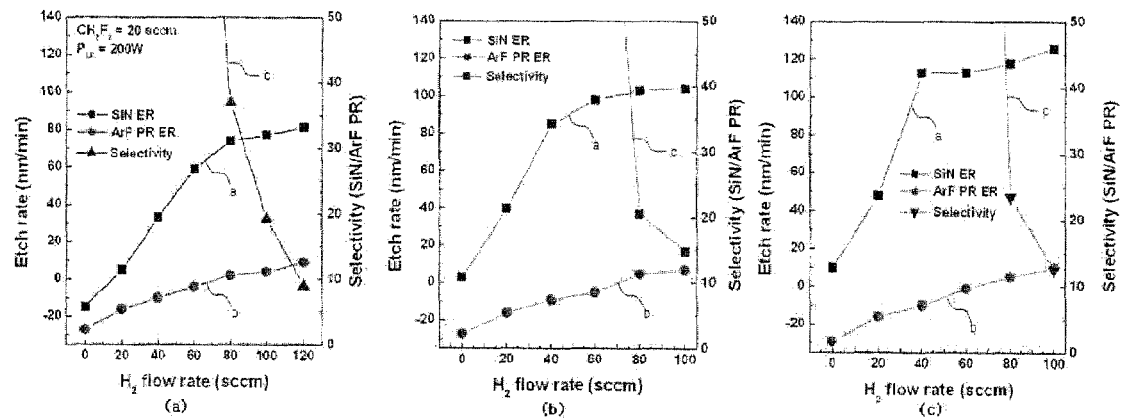
FIG. 5 is a graph illustrating an etch rate according to a change in flow rate of $H_2$ gas.
Figure 6:
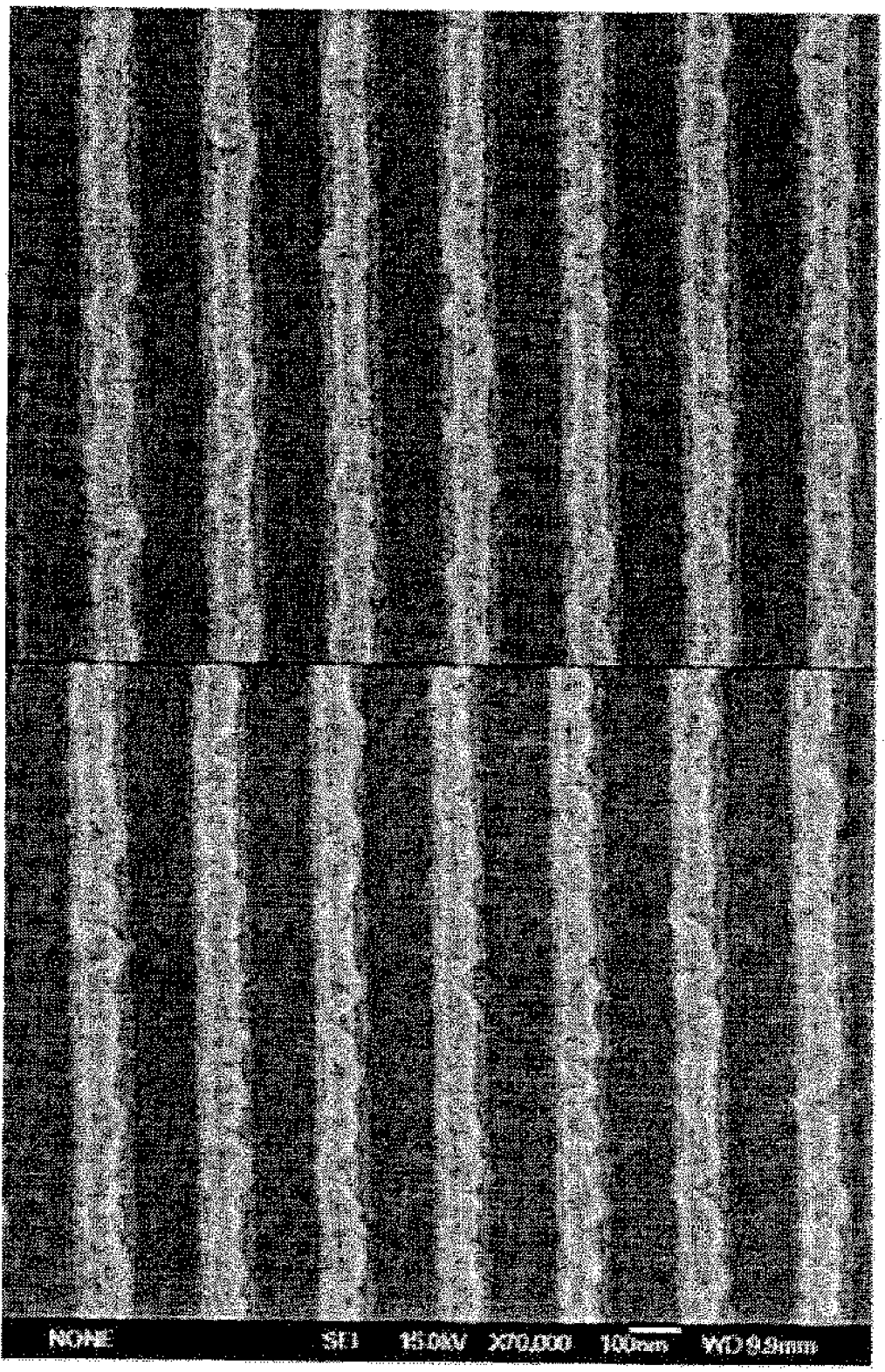
FIG. 6 is a plan photograph of a substrate with a hard mask film etched according to the embodiment of the present invention.
Figure 7:
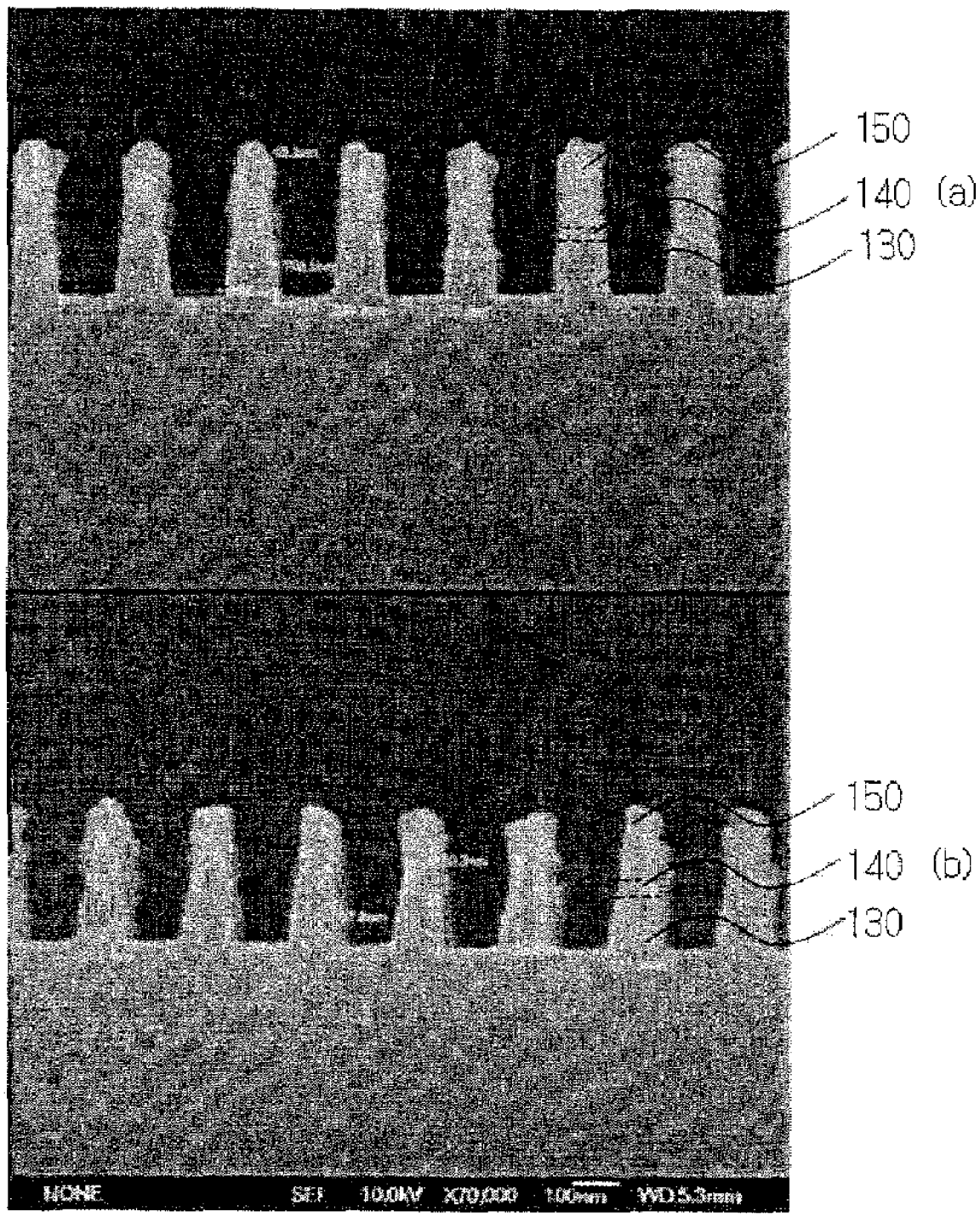
FIGS. 7 and 8 are sectional photographs of the substrate with the hard mask film etched according to the embodiment of the present invention.
Figure 8:
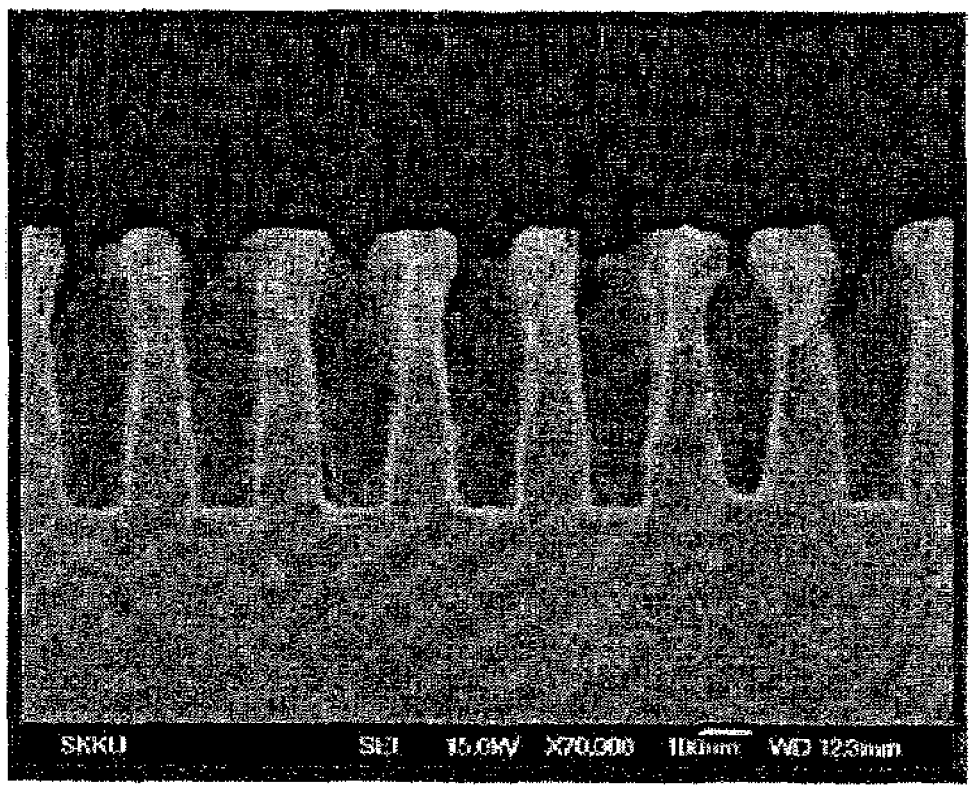
Figure 8:
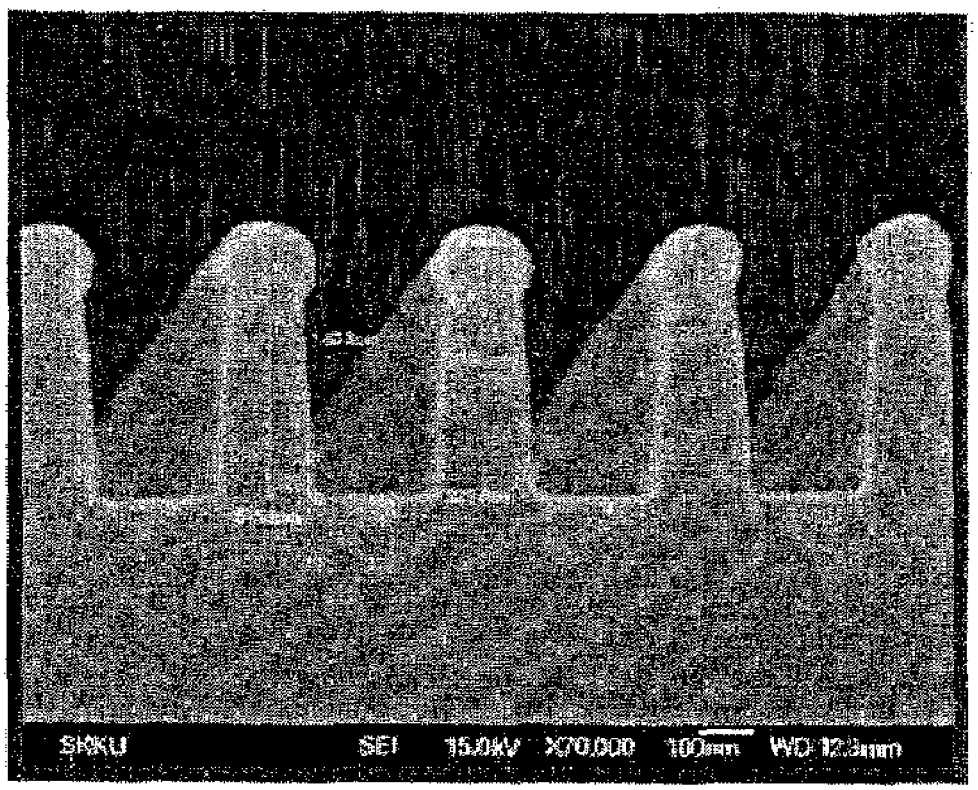

FIG. 4 is a graph illustrating an etch rate according to a change in flow rate of $CH_2F_2$ gas, and FIG. 5 is a graph illustrating an etch rate according to a change in flow rate of $H_2$ gas. FIG. 6 is a plan photograph of a substrate with a hard mask film etched according to the embodiment of the present invention, and FIGS. 7 and 8 are sectional photographs of the substrate with the hard mask film etched according to the embodiment of the present invention.

FIG. 4 illustrates a change in etch rate (see graph a) of the hard mask film 130, and a change in etch rate (see graph b) of the photoresist pattern 150 and a change in etch selectivity (see graph c) of the hard mask film 130 to the photoresist pattern 150 as the flow rate of $CH_2F_2$ gas is changed in a state where the flow rate of $H_2$ gas is maintained to be 80 sccm. At this time, FIGS. 4 (a), (b) and (c) illustrate changes when the electric power of the first high-frequency power source 220 is set as 100, 150 and 200 W, respectively. Here, the other process conditions are identically maintained. It is understood from the graphs of FIG. 4 that as the flow rate of the $CH_2F_2$ gas is increased in a state where the $H_2$ gas has been injected, the etch rate of the hard mask film 130 is decreased, but the etch selectivity of the hard mask film 130 to the photoresist pattern 150 is increased to the infinity. Further, it can be also understood that the etch rate and the etch selectivity are changed according to the power of the applied power.

In addition, FIG. 5 illustrates a change in etch rate (see graph a) of the hard mask film 130, a change in etch rate (see graph b) of the photoresist pattern 150 and a change in etch selectivity (see graph c) of the hard mask film 130 to the photoresist pattern 150 as the flow rate of $H_2$ gas is changed in a state where the flow rate of $CH_2F_2$ gas is maintained to be 20 sccm. At this time, FIGS. 5 (a), (b) and (c) illustrate changes when the electric power of the first high-frequency power source 220 is set as 100, 150 and 200 W as described above, respectively. It is understood from the graphs of FIG. 5 that as the flow rate of the $H_2$ gas is increased in a state where the $CH_2F_2$ gas has been injected, the etch selectivity of the hard mask film 130 to the photoresist pattern 150 is gradually decreased from the value close to the infinity, but the etch rate of the hard mask film 130 is increased.

Upon review of the two graphs, when the etching is performed using the mixed gas including $CH_2F_2$ and $H_2$ gases, the etch rate of an SiN film, i.e., the hard mask film 130, is increased, while the etch rate of the ArF photoresist pattern 150 is a minus value, so that the etch selectivity becomes the value close to the infinity. This is because the polymer 151 is produced on the surface of the ArF photoresist pattern 150 to surround the surface thereof when the $CH_2F_2$ and $H_2$ gases are supplied to the etching equipment.

Accordingly, the collapsing or etching of the ArF photoresist pattern 150 is not generated, so that the hard mask film 130 with a desired pattern can be formed and the etch rate of the hard mask film 130 can be enhanced as shown in photographs of FIGS. 6 to 8. In the above, FIG. 7 is a photograph after the etching has been performed for about 1 minute, and FIG. 8 is a photograph after the etching has been performed for about 3 minutes. That is, FIGS. 6(a), 7(a) and 8(a) are FE-SEM photographs after the hard mask film 130 has been etched by injecting the $CH_2F_2$, $H_2$ and Ar gases at 20, 60 and 500 sccm into the plasma etching equipment of FIG. 3, respectively, and FIGS. 6(b), 7(b) and 8(b) are FE-SEM photographs after the hard mask film 130 has been etched by injecting the $CH_2F_2$, $H_2$ and Ar gases at 20, 100 and 500 sccm into the plasma etching equipment of FIG. 3, respectively. As shown in the photographs, it can be understood that the ArF photoresist pattern 150 on top of the hard mask film 130 is not changed by the etching process for the hard mask film 130 and the hard mask film 130 is patterned with the same shape as the photoresist pattern 150 by using the mixed gas including the $CH_2F_2$ and $H_2$ gases according to the present invention.

This is because the $CH_2F_2$ and $H_2$ gases are introduced into the etching equipment then to be activated by means of plasma, and an activated activating group reacts to the ArF photoresist pattern 150, so that the polymer 151 is formed on the surface thereof. Thus, such a polymer 151 serves as a barrier for preventing the ArF photoresist pattern 150 from being removed by means of the $CH_2F_2$ and $H_2$ gases, so that the etching of the ArF photoresist pattern 150 can be prevented. The polymer 151 also functions to harden an outer surface of the ArF photoresist pattern 150, so that the collapse of the ArF photoresist pattern 150 can be prevented. At this time, the produced polymer 151 is $CF_z$ (z=0.1 to 0.5). As the flow rate of the $CH_2F_2$ gas is increased, an amount of carbon (C) within the polymer 151 and the thickness thereof are relatively increased, so that the durability against the etching of the ArF resist is increased. On the other hand, since an etch reactant such as HCN is produced when the $CH_2F_2$ and $H_2$ gases are added together, a reaction increasing the removal of an N element in the SiN hard mask film 130 is activated, whereby the etching of the hard mask film 130 is continued. In this case, through the etching, the ArF resist is not removed while the hard mask film 130 is continuously removed, so that the etch selectivity close to the infinity can be obtained. However, if the flow rate of the $H_2$ gas is excessively increased, the production rate of the polymer 151 on the ArF resist pattern 150 is reduced, so that the etch rate of the ArF resist as well as the hard mask film is also increased, and the etch selectivity has a relatively smaller value. Therefore, in order to obtain an etch selectivity of the value close to the infinity, an appropriate combination of the flow rates of the $CH_2F_2$ and $H_2$ gases becomes one of important process parameters.

Figure 2D:
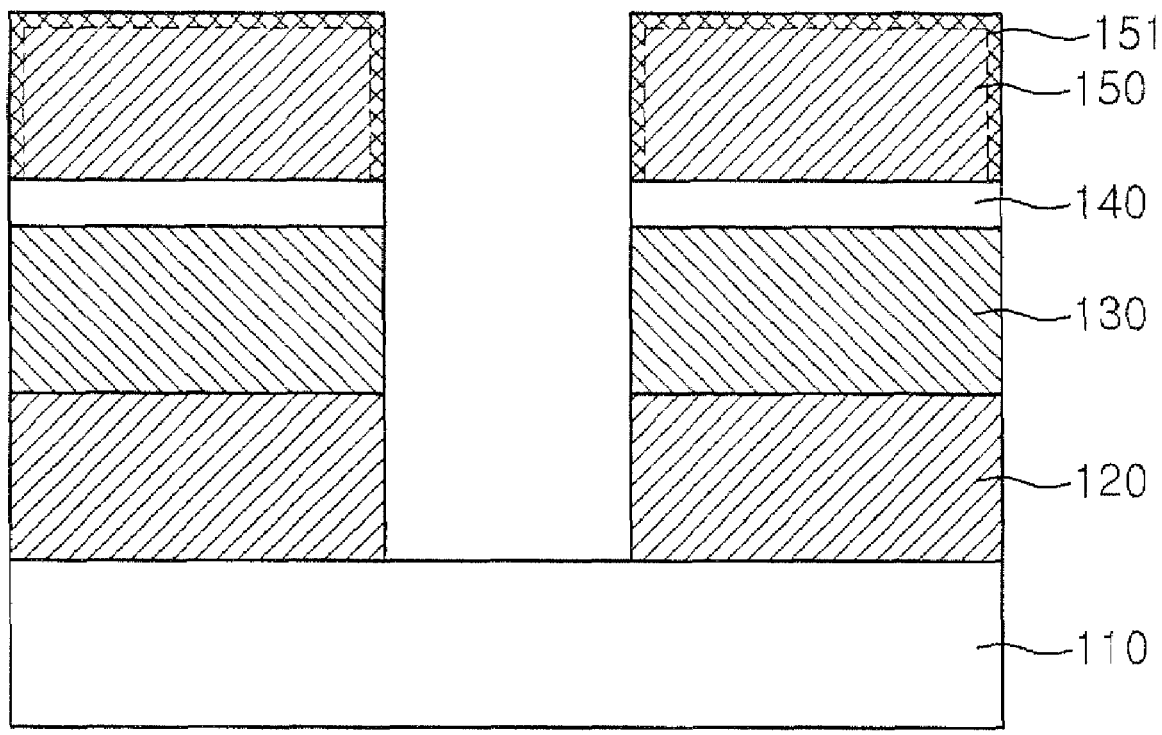

As shown in FIG. 2d, a portion of the thin film 120 is removed through the etching process using the patterned hard mask film 130 and ArF photoresist pattern 150 as an etching mask, and thus the thin film 120 is patterned. Then, the ArF photoresist pattern 150 and the hard mask film 130 are removed to form a thin film pattern.

The general patterning method for a thin film has been described in the aforementioned descriptions.

The method of pattering a thin film according to this embodiment may be applied to patterning of a device isolation film and gate electrode and line of a semiconductor device, and metal wiring including source and drain lines.

That is, a hard mask film is formed on a semiconductor substrate using a silicon nitride film, and a photoresist pattern is formed on top thereof. Thereafter, the hard mask film is etched using a mixed gas including $CH_2F_2$, $H_2$ and Ar gases and thus a portion of the semiconductor substrate is exposed. Next, the exposed portion of the semiconductor substrate is etched to form a trench by performing an etching process using the hard mask film and photoresist pattern as an etching mask. Thereafter, the trench is filled with an HDP oxidation film, a planarization process is performed using the hard mask film as a stop film, and the hard mask film is then removed, thus to form a device isolation film. It will be apparent that the aforementioned method is only an embodiment for forming a trench for a semiconductor device. Thus, the present invention is not limited thereto, but may be variously modified.

In the meantime, a gate oxidation film and a conductive film are sequentially formed on a semiconductor substrate, and a hard mask film and a photoresist pattern are formed thereon. The hard mask film is etched using a mixed gas including $CH_2F_2$, $H_2$ and Ar gases, so that a portion of the conductive film is exposed. Thereafter, the exposed portion of the conductive film is removed by performing an etching process using the hard mask film as an etching mask, thus to form a gate electrode and a gate line. It will be apparent that the aforementioned description is only an embodiment for forming a gate electrode and a gate line for a semiconductor device. Thus, the present invention is not limited to the above embodiment, but may be variously modified.

Further, a gate electrode and device isolation films may be simultaneously formed. That is, a gate oxidation film, a conductive film and a hard mask film are sequentially formed on a semiconductor substrate, and a pliotoresist pattern is then formed on top thereof. The hard mask film is etched using a mixed gas including $CH_2F_2$, $H_2$ and Ar gases, and a portion of the conductive film, the gate oxidation film and the substrate is then etched by performing an etching process using the hard mask film as an etching mask to form a trench. Then, after the trench is filled with an HDP oxidation film, a gate electrode and a gate line are formed by performing a planarization process using the conductive film as a stop film, and a device isolation film is simultaneously formed.

In addition, an interlayer insulation film is formed on a substrate having source and drain electrodes or a lower metal wiring formed thereon, a hard mask film is formed on the interlayer insulation film, and a photoresist pattern is then formed on top of the hard mask film. Then, after the hard mask film is etched using a mixed gas including $CH_2F_2$, $H_2$ and Ar gases, the interlayer insulation film is etched by performing an etching process using the hard mask film as an etching mask to form a contact hole exposing a lower source electrode, a drain electrode or a lower metal wiring, and the hard mask film is removed. Thereafter, a conductive film filling the contact hole is formed, and a metal wiring is then formed by patterning the conductive film on the interlayer insulation film. Although the embodiment of forming a metal wiring through a single damascene process has been briefly described in the aforementioned description, the present invention is not limited thereto. That is, the metal wiring may be formed through various modifications.

As such, the present invention may be applied to the whole processes of manufacturing a semiconductor device depending on the shape of a lower thin film.

Although the forming of a single SiN film using a hard mask film has been described in the foregoing, the present invention is not limited thereto. That is, a multi-layered film may be used as hard mask film. In other words, as the hard mask film, a film having at least two layers, in which silicon nitride and/or oxide films are formed, may be used.

As described above, according to the present invention, an etch selectivity of the hard mask film to the photoresist pattern can be increased using a mixed gas including $CH_2F_2$ and $H_2$ gases when etching the hard mask film under the photoresist pattern used in a wavelength of 193 nm or less.

The present invention is not limited to the aforementioned embodiments but may be implemented into different forms. That is, the embodiments are provided only for illustrative purposes and for full understanding of the scope of the present invention by those skilled in the art. Further, the scope of the present invention should be understood within the scope of the present invention defined by the appended claims.

What is claimed is:

1. A method of forming an etching mask, comprising the steps of:
   depositing a hard mask film comprising SiN on a substrate;
   depositing a photoresist on the hard mask film, the photoresist comprising an ArF (193 nm) resist;
   patterning the photoresist; and
   etching the hard mask film using the photoresist pattern as a mask and using an etching gas including a $CH_2F_2$ gas injected at a flow rate of 20 to 40 sccm and $H_2$ gas injected at a flow rate of 40 to 80 sccm so that etch selectivity of the hard mask to the photoresist approaches infinity.

2. The method as claimed in claim 1, wherein the etching gas further comprises Ar.

3. The method as claimed in claim 1, wherein the hard mask film is formed in a single or multiple layer film and the hard mask film further comprises a silicon oxide.

4. The method as claimed in claim 1, further comprising the steps of:
   depositing a anti reflective coating (ARC) between the hard mask film and the photoresist pattern; and
   etching the ARC before etching the hard mask film.

5. A method of forming an etching mask to etch a film under a hard mask film on a substrate having the hard mask film comprising SiN and a patterned photoresist sequentially formed thereon, the patterned photoresist comprising an ArF (193 nm) resist, the method comprising the step of:
   etching the hard mask film using the photoresist pattern as a mask and using an etching gas including a $CH_2F_2$ gas injected at a flow rate of 20 to 40 sccm and $H_2$ gas injected at a flow rate of 40 to 80 sccm so that etch selectivity of the hard mask to the photoresist approaches infinity.

6. The method as claimed in claim 5, wherein the etching gas further comprises Ar gas injected at a flow rate of 200 to 800 sccm.

7. A method of forming an etching mask to etch a film under a hard mask film on a substrate having the hard mask film comprising SiN, a ARC and a patterned photoresist sequentially formed thereon, the patterned photoresist comprising an ArF (193 nm) resist, the method comprising the steps of:

etching the ARC using the photoresist pattern as a mask; and etching the hard mask film using the photoresist pattern and ARC as a mask while a surface of the photoresist pattern is polymerized, and using an etching gas including a $CH_2F_2$ gas injected at a flow rate of 20 to 40 sccm and H2 gas injected at a flow rate of 40 to 80 sccm so that etch selectivity of the hard mask to the photoresist approaches infinity.

\* \* \* \* \*